US010171895B2

(12) United States Patent
Weber et al.

(10) Patent No.: US 10,171,895 B2
(45) Date of Patent: Jan. 1, 2019

(54) HYDROPHOBIC MESH COVER

(71) Applicant: Apple Inc., Cupertino, CA (US)

(72) Inventors: Douglas J. Weber, San Francisco, CA (US); Naoto Matsuyuki, Kasugai (JP)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/409,419

(22) Filed: Jan. 18, 2017

(65) Prior Publication Data

US 2017/0127163 A1 May 4, 2017

Related U.S. Application Data

(63) Continuation of application No. 14/474,435, filed on Sep. 2, 2014, now Pat. No. 9,573,165.
(Continued)

(51) Int. Cl.

| *H04R 1/02* | (2006.01) |
| *B05D 5/04* | (2006.01) |
| *G10K 11/00* | (2006.01) |
| *B05D 5/00* | (2006.01) |
| *B32B 5/02* | (2006.01) |

(Continued)

(52) U.S. Cl.
CPC .............. *H04R 1/023* (2013.01); *B05D 5/00* (2013.01); *B05D 5/04* (2013.01); *B32B 5/028* (2013.01); *G10K 11/004* (2013.01); *H01J 37/32394* (2013.01); *H04R 29/001* (2013.01); *B32B 37/144* (2013.01); *B32B 2255/02* (2013.01); *B32B 2305/38* (2013.01); *B32B 2307/10* (2013.01); *B32B 2307/724* (2013.01); *B32B 2307/728* (2013.01); *B32B 2307/73* (2013.01); *B32B 2457/00* (2013.01); *B32B 2571/00* (2013.01); *H01J 2237/3341* (2013.01); *H04R 2499/11* (2013.01)

(58) Field of Classification Search
CPC ....... F26B 25/00; H04R 1/023; H04R 29/001; H04R 2499/11; B05D 5/00; B32B 5/028; B32B 2255/02; B32B 2307/10; B32B 2307/724; B32B 2237/3341
USPC .......................................................... 34/90
See application file for complete search history.

(56) References Cited

U.S. PATENT DOCUMENTS 4,312,580 A * 1/1982 Schwomma ........... G03B 17/08
340/605
5,041,330 A 8/1991 Heerten et al.
(Continued)

FOREIGN PATENT DOCUMENTS

JP 4271507 6/2009
JP 4680011 B2 * 5/2011 ............ H04R 3/007
(Continued)

OTHER PUBLICATIONS

"Google search for waterproof phones", May 21, 2016, 3 pages.
(Continued)

*Primary Examiner* — Stephen M Gravini
(74) *Attorney, Agent, or Firm* — Kilpatrick Townsend & Stockton LLP

(57) ABSTRACT

A screen having a hydrophobic portion to resist the entry of liquid into an acoustic module and a hydrophilic portion to aid in the removal of liquid from an acoustic chamber is described. The screen is placed in an orifice in the acoustic module between the external environment and the internal acoustic chamber.

20 Claims, 9 Drawing Sheets

Related U.S. Application Data

(60) Provisional application No. 62/040,618, filed on Aug. 22, 2014.

(51) Int. Cl.
*H01J 37/32* (2006.01)
*H04R 29/00* (2006.01)
*B32B 37/14* (2006.01)

(56) References Cited

U.S. PATENT DOCUMENTS

| | | | |
|---|---|---|---|
| 5,373,487 A | 12/1994 | Crawford et al. | |
| 5,420,935 A | 5/1995 | Ikuo et al. | |
| 6,389,143 B1 | 5/2002 | Leedom et al. | |
| 6,855,173 B2 | 2/2005 | Ehrnsperger et al. | |
| 6,983,130 B2 * | 1/2006 | Chien | H04M 1/18 379/433.01 |
| 7,605,687 B2 | 10/2009 | Morris et al. | |
| 7,876,919 B2 * | 1/2011 | Ram | H04R 1/086 381/322 |
| 8,054,992 B2 | 11/2011 | Sapiejewski | |
| D653,640 S | 2/2012 | Kwon et al. | |
| 8,135,149 B2 * | 3/2012 | Yoshida | H04R 3/007 367/163 |
| 8,525,689 B2 | 9/2013 | Lewis et al. | |
| 8,558,708 B2 | 10/2013 | Albert et al. | |
| 8,810,426 B1 | 8/2014 | Morris | |
| 8,826,558 B2 | 9/2014 | Priebe et al. | |
| 8,844,158 B2 | 9/2014 | Dehn | |
| 9,072,991 B2 | 7/2015 | Winters et al. | |
| 9,080,961 B2 | 7/2015 | Adachi | |
| 9,084,053 B2 | 7/2015 | Parkins | |
| 9,094,747 B2 * | 7/2015 | Rayner | H04R 1/2834 |
| 9,161,434 B2 | 10/2015 | Merz et al. | |
| 9,179,220 B2 | 11/2015 | Morris | |
| 9,204,525 B2 * | 12/2015 | Thompson | H05F 3/00 |
| 9,220,328 B2 * | 12/2015 | Magness | A45C 11/00 |
| 9,226,076 B2 * | 12/2015 | Lippert | H04R 1/023 |
| 9,335,355 B2 | 5/2016 | Keeler et al. | |
| 9,451,354 B2 * | 9/2016 | Zadesky | H04R 1/023 |
| 9,469,469 B2 * | 10/2016 | Rayner | G06F 1/1626 |
| 9,573,165 B2 * | 2/2017 | Weber | B05D 5/04 |
| 9,660,684 B2 * | 5/2017 | Rayner | H04B 1/3888 |
| 9,774,192 B2 * | 9/2017 | Wojcik | H02J 4/00 |
| 9,820,038 B2 * | 11/2017 | Salvatti | H04R 1/44 |
| 2007/0003081 A1 | 1/2007 | Ram et al. | |
| 2008/0149417 A1 | 6/2008 | Dinh et al. | |
| 2009/0281251 A1 | 11/2009 | Bae et al. | |
| 2010/0224574 A1 | 9/2010 | Youngs et al. | |
| 2010/0278368 A1 | 11/2010 | Martin et al. | |
| 2011/0077063 A1 * | 3/2011 | Yabe | H04M 1/0237 455/575.4 |
| 2011/0097571 A1 * | 4/2011 | Tee | C08J 7/042 428/315.9 |
| 2012/0082317 A1 | 4/2012 | Pance et al. | |
| 2012/0198718 A1 | 8/2012 | Odueyungbo et al. | |
| 2013/0170685 A1 | 7/2013 | Oh et al. | |
| 2013/0242481 A1 | 9/2013 | Kim et al. | |
| 2013/0333978 A1 | 12/2013 | Abe et al. | |
| 2014/0083296 A1 * | 3/2014 | Sanders | G06F 1/1656 96/11 |
| 2014/0112510 A1 | 4/2014 | Yang et al. | |
| 2014/0193018 A1 | 7/2014 | Lim et al. | |
| 2014/0321662 A1 | 10/2014 | Kihm et al. | |
| 2014/0334653 A1 | 11/2014 | Luna et al. | |
| 2016/0353186 A1 | 12/2016 | Rothkopf | |
| 2017/0127163 A1 * | 5/2017 | Weber | H04R 1/023 |

FOREIGN PATENT DOCUMENTS

| | | | |
|---|---|---|---|
| WO | 2012117476 | 9/2012 | |
| WO | WO 2015167848 A1 * | 11/2015 | H04R 1/023 |
| WO | 2016190957 | 12/2016 | |

OTHER PUBLICATIONS

U.S. Appl. No. 14/474,435 , "Non-Final Office Action", dated May 25, 2016, 13 pages.

U.S. Appl. No. 14/474,435 , "Notice of Allowance", dated Oct. 5, 2016, 5 pages.

U.S. Appl. No. 14/722,708 , "Non-Final Office Action", dated Jul. 1, 2016, 9 pages.

* cited by examiner

HYDROPHOBIC MESH COVER

CROSS-REFERENCES TO RELATED APPLICATIONS

This application is a continuation of U.S. Non-Provisional application Ser. No. 14/474,435, filed Sep. 2, 2014; which claims the benefit of U.S. provisional patent application No. 62/040,618, filed Aug. 22, 2014; the disclosures of which are hereby incorporated herein by reference in their entirety.

TECHNICAL FIELD

This disclosure relates generally to acoustic modules, and more specifically to prevention of liquid from entering an acoustic cavity of an acoustic module and facilitating removal of any liquid that does so enter. In still greater particularity, the disclosure relates to a mesh screen with two surfaces, one to inhibit entry of liquid into the acoustic module and another layer to facilitate the removal of any liquid that does pass through the first layer and enters into the acoustic module.

BACKGROUND OF THE INVENTION

An acoustic module integrated into a device can be used to transmit or receive acoustic signals. In a typical device, the acoustic signals are transmitted to or received from a surrounding medium (e.g., air). To facilitate communication with the surrounding medium, the acoustic module may be at least partially exposed to the environment surrounding the device via one or more orifices or openings that permit sound waves to both enter and exit the acoustic module.

In some cases, an acoustic module may include one or more components that are disposed within a cavity or chamber to help protect the components from the external environment. In some cases, the components may be acoustically coupled to the cavity to produce a particular acoustic response. Typically, at least some portion of the cavity or chamber is exposed to the external environment to allow acoustic signals to be transmitted to or received from the surrounding medium. However, because the cavity or chamber is exposed to the external environment, liquid or moisture may accumulate or become trapped in the cavity or chamber, which may impair the performance of the acoustic module.

Thus, it is generally desirable to prevent the ingress of moisture into an acoustic module. However, in some cases, the complete prevention of liquid ingress is not possible or practical. Thus, there may be a need for a system and technique for facilitating the evacuation or removal of moisture that has entered or accumulated in an acoustic module. It would be particularly useful to have a device that acts to both inhibit entry of liquid into the acoustic module and to facilitate the removal of any liquid that does pass through the device and enters into the acoustic module chamber.

BRIEF SUMMARY OF THE INVENTION

The embodiments described herein are directed to an acoustic module that includes a screen cover portion which is configured to both inhibit entry of liquid into the acoustic module chamber and to facilitate the removal of any liquid that does enter into the acoustic module chamber. In one example embodiment, the acoustic module includes a mesh cover that is configured to be hydrophobic on an external surface, thereby repelling liquid from outside the acoustic module, and hydrophilic on an interior surface, e thereby facilitating the removal of liquid that has entered the acoustic module chamber. In some embodiments, the acoustic module is incorporated into a portable electronic device.

In one embodiment, the acoustic module includes a two layer mesh screen to cover the opening of the acoustic module associated with the exterior of the portable electronic device. In some embodiments, the acoustic module chamber is a speaker element. In some other embodiments, the acoustic element is a microphone element. In one example embodiment, the speaker element or the microphone element is configured to generate an acoustic pulse that facilitates movement of the liquid within the acoustic module chamber in combination with the mesh cover.

The present disclosure includes systems, techniques, and apparatuses for inhibiting the entry of liquid into, and expelling liquid from, a cavity of an acoustic module through an orifice or opening of the module. In one example, the hydrophobicity of the screen which covers the entry port into the acoustic chamber from outside the portable electronic device is varied to inhibit moisture into, and facilitate the removal of moisture from, the acoustic module. Additionally, the acoustic module, which may include a speaker mechanism, may be configured to produce acoustic waves that also facilitate expulsion of liquid from the acoustic module.

Additionally, in some cases, an acoustic sensor (e.g., a microphone) may be used to detect the presence of liquid or quantify the amount of liquid in the acoustic cavity. For example, an acoustic module may generate a calibrated tone or stimulus that results in an acoustic signal that is received by the acoustic sensor. The presence of liquid and/or the amount of liquid may be determined based on the acoustic signal received by the acoustic sensor. In some cases, additional liquid expulsion operations may be performed in response to this determination.

One sample embodiment may take the form of a semi-permeable barrier material for an acoustic module, said module including a port adjacent an external environment and an acoustic chamber, the material comprising: a first side facing said external environment and exhibiting a hydrophobic characteristic; and a second side facing said acoustic chamber and opposite the first side, and exhibiting a hydrophilic characteristic; wherein the material is positioned within the port.

Another sample embodiment takes the form of a method for manufacturing a cover for an acoustic module, comprising the operations of: providing a first mesh material having a first size mesh opening; providing a second mesh material having a second size mesh opening smaller than said first size mesh opening; and laminating said first mesh material and said second mesh material to form said cover.

Still another embodiment may take the form of a method for removing liquid from an acoustic chamber comprising the operations of: placing a screen portion having a hydrophobic side and a hydrophilic side in a port of said acoustic chamber; positioning said hydrophobic side adjacent the an exterior environment outside said acoustic chamber; positioning said hydrophilic side adjacent an interior portion of said acoustic chamber; detecting the presence of liquid in said interior portion; and inducing said liquid to move to said hydrophilic side; whereby said liquid moves from said hydrophilic side to said hydrophobic side by capillary action.

DETAILED DESCRIPTION OF THE INVENTION

Figure 1:
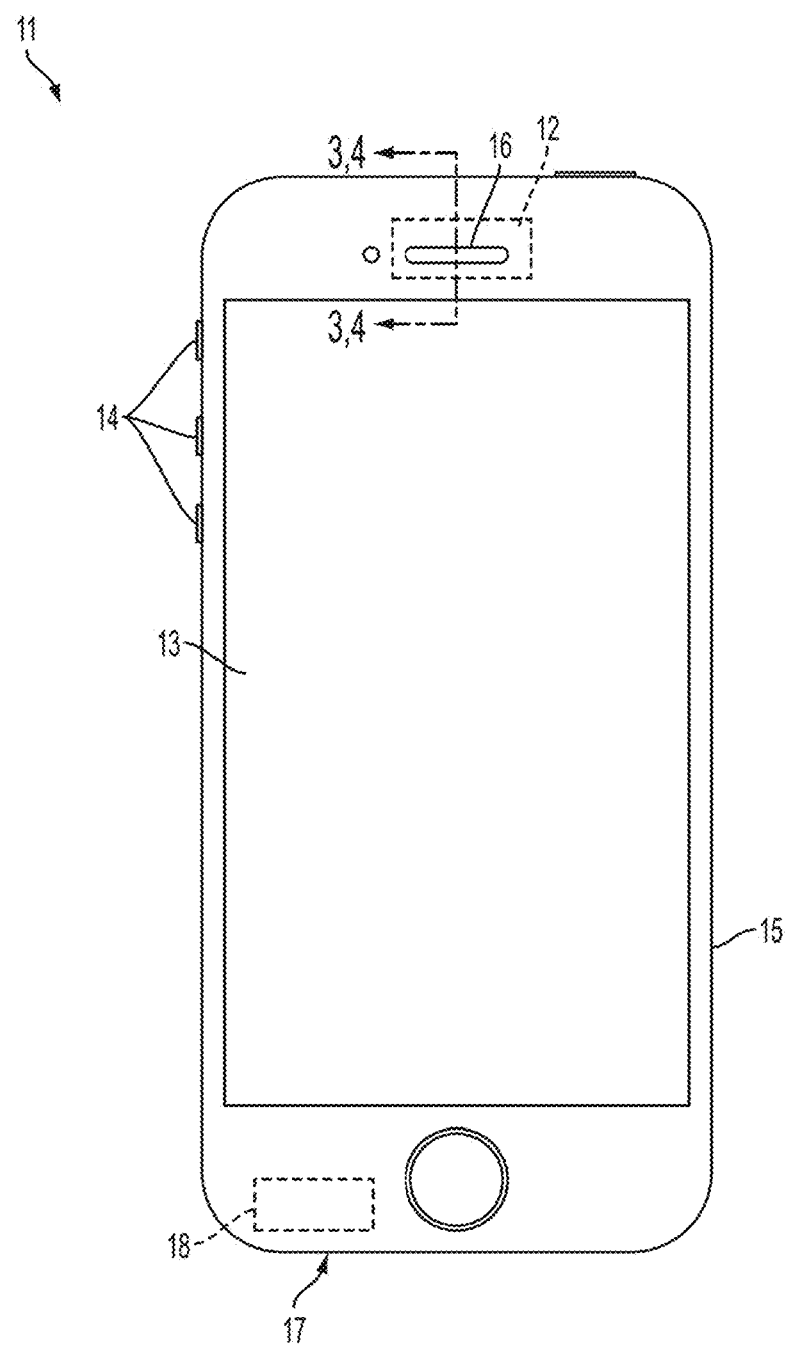
FIG. 1 depicts an electronic device having at least one acoustic module.

The description that follows includes embodiments of systems and processes that embody various elements of the present disclosure. Reference will now be made in detail to representative embodiments illustrated in the accompanying drawings and in particular with reference to FIGS. 1-9. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims. Those skilled in the art will readily appreciate that the detailed description given herein with respect to these figures is for explanatory purposes only and should not be construed as limiting as the described disclosure may be practiced in a variety of forms in addition to those described herein Like reference numerals denote like structure throughout each of the various figures.

FIG. 1 depicts an example portable electronic device 11 including an acoustic module 12 contained within portable electronic device 11. In this example, portable electronic device 11 is a mobile telephone, such as a smart phone, although alternative embodiments may take the form of any suitable electronic device including (but not limited to) a tablet computing device, a portable computer, a media player, a wearable computing device, a device for telling time, a health-monitoring device, and so on. Certain embodiments may include a display for depicting information to a user; the display 13 may be touch-sensitive in some embodiments and function to accept user input. In the example embodiment shown in FIG. 1, portable electronic device 11 also includes interface buttons 14 for providing additional input to portable electronic device 11. Portable electronic device 11 includes a housing 15 used to protect the internal components of portable electronic device 11. Housing 15 may be formed from a substantially rigid shell structure that serves as the mechanical support for various components of portable electronic device 11, including touch screen display 13, interface buttons 14, and one or more acoustic modules 12.

As shown in FIG. 1, housing 15 includes a first acoustic speaker port 16 that is coupled to acoustic module 12. In this example, acoustic module 12 is configured to function as an earpiece or speaker for mobile telephone 11. Housing 15 also includes a microphone port 17 extending through the housing 15, coupled to a microphone acoustic module 18. It should be appreciated that the speaker port 16 and/or microphone port 17 may be located on any suitable surface of the electronic device and need not occupy a particular area.

Acoustic modules 12 and 18 are coupled to respective acoustic ports 16 and 17. Acoustic modules 12 and 18 are configured to transmit and/or receive signals in response to a command or control signal provided by a controller 19 as described in FIG. 2 below. In some cases, intermediate circuitry may facilitate the electrical interface between the controller 19 and the acoustic modules 12 and 18.

Figure 2:
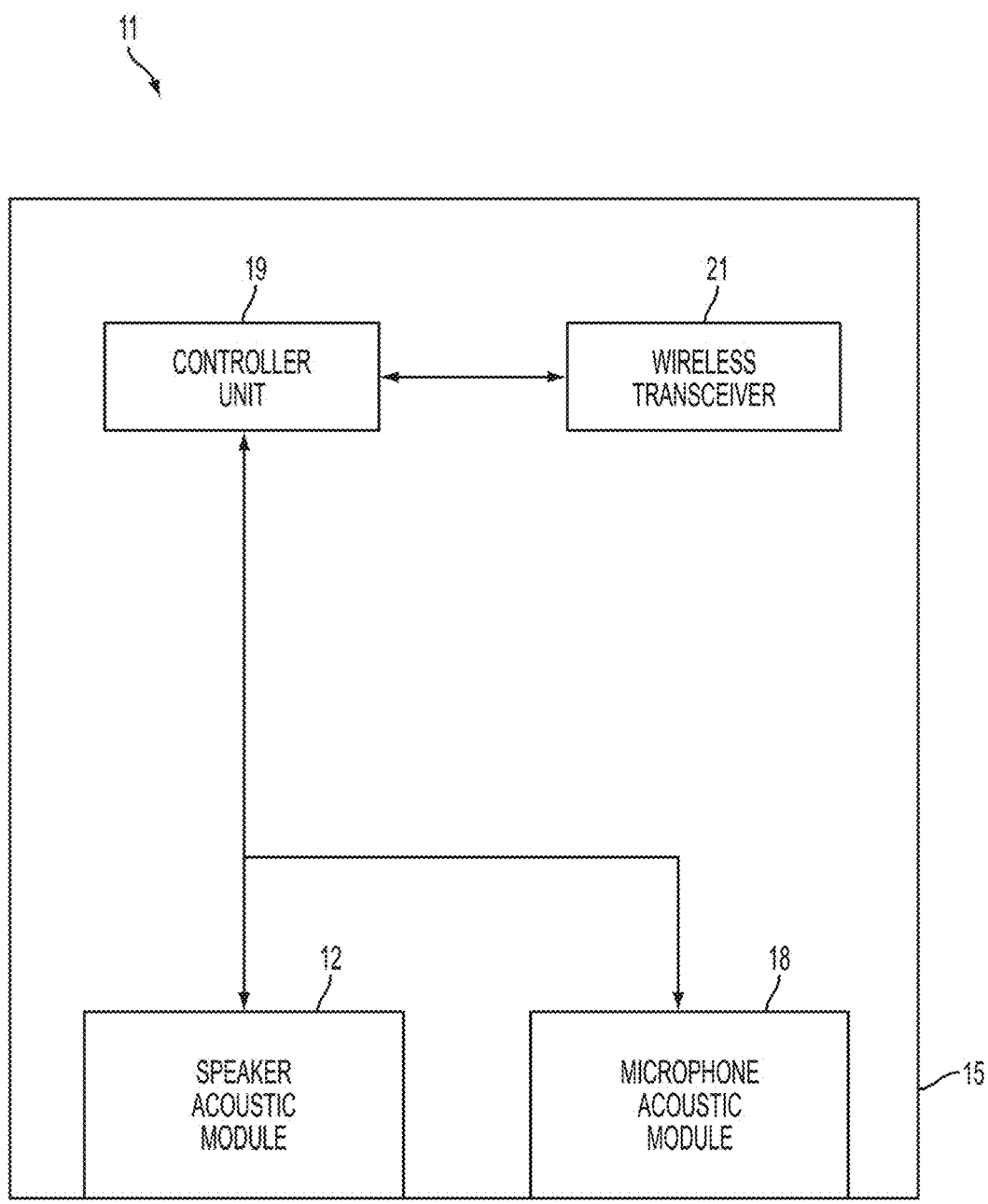
FIG. 2 depicts a block diagram of example functional components of an electronic device having at least one acoustic module.

FIG. 2 depicts a schematic diagram of example components of portable electronic device 11 that are located within the housing 15, although many components are omitted for purposes of simplicity and clarity. As shown in FIG. 2, portable electronic device 11 may include one or more controller units 19, one or more speaker acoustic modules 12, and/or one or more microphone acoustic modules 18. In this example, the controller device 19 may execute instructions and carry out operations associated with portable electronic devices as are described herein. Using instructions from device memory, controller 19 may regulate the reception and manipulation of input and output data between components of the electronic device 11. Controller 19 may be implemented in a computer chip or chips. Various architectures can be used for controller 19 such as microprocessors, application specific integrated circuits (ASICs) and so forth. Controller 19, together with an operating system, may execute computer code and manipulate data. The operating system may be a well-known system such as iOS, Windows, Unix or a special purpose operating system or other systems as are known in the art. Controller device 19 may include memory capability to store the operating system and data. Controller device 19 may also include application software to implement various functions associated with the portable electronic device. Portable electronic device 11 also may include a wireless transceiver 21 connected to controller 19.

Although FIG. 2 illustrates the portable electronic device 11 as including particular components, this is provided only as an example. In various implementations, the portable electronic device 11 may include additional components beyond those shown and/or may not include some components shown without departing from the scope of the present disclosure. For example, portable electronic device 11 may include only one of a speaker acoustic module 12 and a microphone acoustic module 18. Alternatively, the device may include additional acoustic modules or other types of acoustic modules.

In the embodiment example described herein, the portable electronic device 11 is a smart phone. However, it is understood that portable electronic device 11 depicted in FIG. 1 is simply one example and that other types of devices may include one or more acoustic modules. Other types of devices include, without limitation, a laptop computer, a desktop computer, a cellular phone, a media player, a wearable device, a health-monitoring device, a tablet computer, a mobile computer, a telephone, and/or other electronic device.

Figure 3:
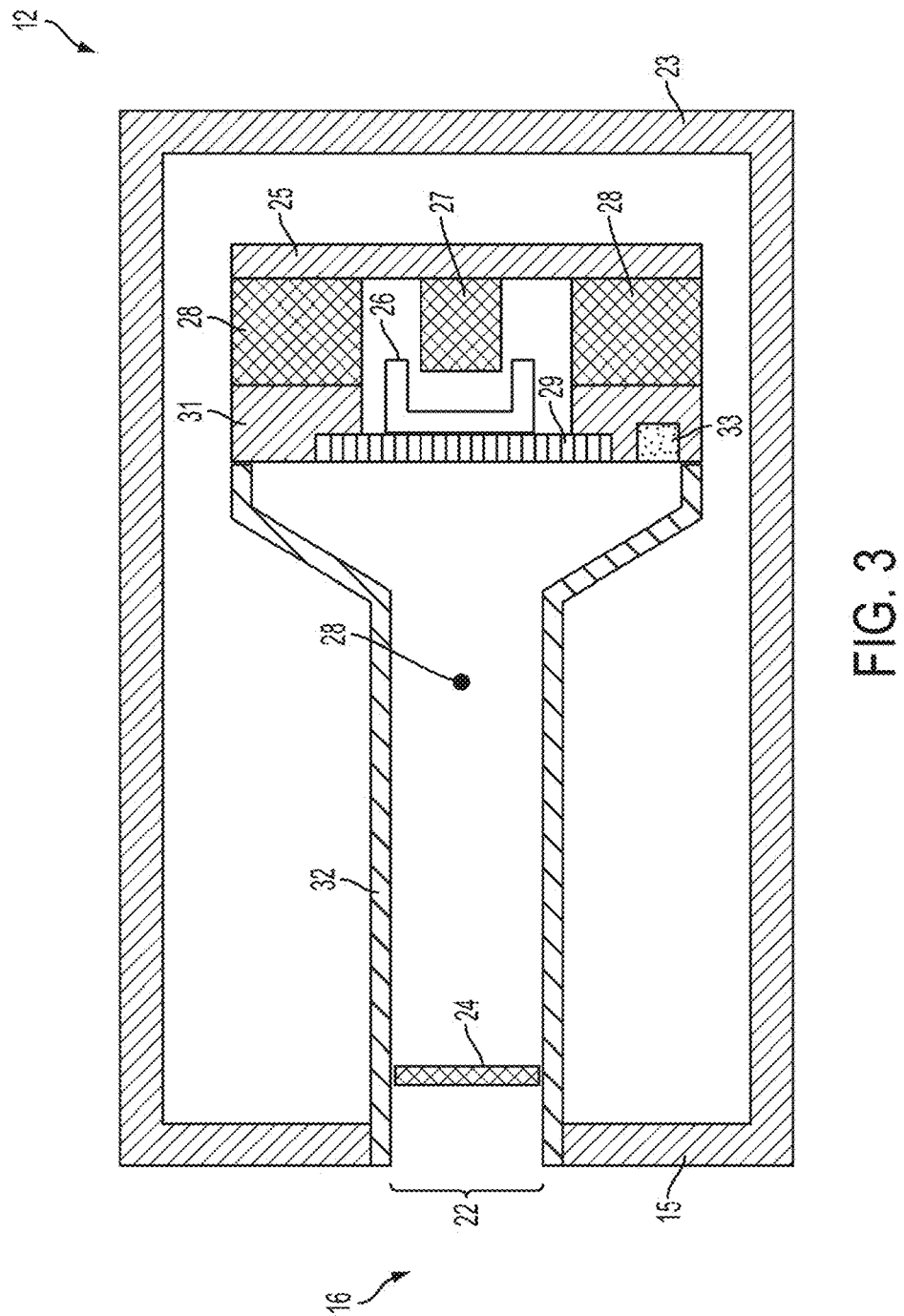
FIG. 3 depicts a cross-sectional view of an example acoustic module taken along section A-A of FIG. 1.

An example acoustic module is shown in FIG. 3, depicting a cross-sectional view of speaker acoustic module 12 and speaker acoustic port 16 taken along section A-A of FIG. 1. The cross-sectional view of FIG. 3 is not drawn to scale and may omit some elements for clarity. Further, the cross-sectional view may show a sample spatial relationship between various components that may vary between embodiments, and so is meant as an example only.

Speaker acoustic port 16 includes an opening 22 that facilitates the transmission of audible signals from acoustic module 12 to an exterior environment, such as the user's ear.

Orifice 22 extends through the housing 15 and connects internal components of the acoustic module 12 with the external environment. In other examples, a single acoustic port may include or be formed from multiple orifices. As described in more detail with respect to FIG. 4, speaker acoustic port 16 may also include a cover 24, which may include a semi-permeable barrier such as screen mesh or other protective element configured to inhibit ingress of liquid or other foreign matter but allowing sound waves to pass therethrough. In an alternate embodiment, housing 15 also includes a second acoustic port 17 that is coupled to a microphone acoustic module 18 that is configured to function as a mouthpiece or microphone for the mobile telephone. Microphone acoustic port 17 also includes one or more openings or orifices to facilitate the transmission of sound from the user to the microphone acoustic module 18, which may also include a semi-permeable barrier such as screen mesh or protective element to inhibit ingress of liquid or other foreign matter as described with respect to speaker acoustic port 16 in FIG. 3.

In one embodiment depicted in FIG. 3, acoustic module 12 is a speaker module. As shown in FIG. 3, speaker acoustic module 12 includes various components for producing and transmitting sound, including a diaphragm 25, a voice coil 26, a center magnet 27, and side magnets/coils 28. In a typical implementation, the diaphragm 25 is configured to produce sound waves or an acoustic signal in response to a stimulus signal in the voice coil 26. That is, a modulated stimulus signal in the voice coil 26 causes movement of the center magnet 27, which is coupled to the diaphragm 25. Movement of the diaphragm 25 creates the sound waves, which propagate through an acoustic cavity 28 of acoustic module 12 and eventually out acoustic port 16 to a region external to the device. In some cases, the acoustic cavity 28 functions as an acoustical resonator having a shape and size that is configured to amplify and/or dampen sound waves produced by movement of diaphragm 25.

As shown in FIG. 3, the acoustic module 12 also includes a yoke 29, connector elements 31, and a cavity wall 32. These elements provide the physical support of the speaker elements. Additionally, the connector elements 31 and the cavity wall 32 together form the partially enclosed acoustic cavity 28. The specific structural configuration of FIG. 3 is not intended to be limiting. For example, in alternative embodiments, the acoustic cavity may be formed from additional components or may be formed from a single component.

The acoustic module 12 depicted in FIG. 3 is provided as one example of a type of speaker acoustic module. In other alternative implementations, the speaker module may include different configurations for producing and transmitting sound, including, for example, a vibrating membrane, piezoelectric transducer, vibrating ribbon, or the like. Additionally, in other alternative implementations, the acoustic module may be a microphone acoustic module having one or more elements for converting acoustic energy into an electrical impulse. For example, the acoustic module may alternatively include a piezoelectric microphone element for producing a charge in response to acoustic energy or sound.

As previously mentioned, because the acoustic port 16 connects the acoustic module 12 to the external environment, there is a possibility that liquid may accumulate or infiltrate the interior of the module. In some cases, even with the screen element 24 or other protective elements in place, liquid may enter the acoustic cavity 28 of the module. For example, if the device is immersed in a liquid or subjected to a liquid under pressure, some liquid ingress may occur.

Additionally, naturally occurring moisture in the air may condense and accumulate over time resulting in the presence of liquid within the module. In such cases, the accumulation of liquid in, for example, the acoustic cavity 28, may affect the performance of the acoustic module 28 by changing the acoustic dynamics of the cavity 28, diaphragm 25, or other elements of the acoustic module 12.

Thus, in one embodiment, acoustic module 12 may include one or more elements configured to inhibit the entry of liquid into acoustic cavity 28 and facilitate the exit of any liquid that does enter acoustic cavity 28. As shown in FIG. 3, protective screen 24 is located at opening 22 in the acoustic cavity 28. In some embodiments, screen element 24 may be configured with one or more hydrophobic surfaces, such as one or more hydrophobic coatings (such as manganese oxide polystyrene, zinc oxide polystyrene, precipitated calcium carbonate, carbon-nanotubes, silica nano-coating, polytetrafluoroethylene, silicon, various flouropolymers, and so on).

As shown in FIG. 3, acoustic module 12 may also include a speaker formed from a diaphragm element 25 and a voice coil 26. In cases where the acoustic module 12 includes a speaker, one or more acoustic energy pulses may be applied to further facilitate expulsion of liquid from the acoustic module 12. In one example, the acoustic energy pulses may be generated at a frequency that is outside the audible range of a human ear. A typical range of acoustic frequencies that are audible to humans may be between 20 Hz and 20,000 Hz. Thus, the acoustic energy pulse(s) used to help expel the liquid may be less than 20 Hz or greater than 20,000 Hz. Generally, if an acoustic energy pulse is not audible to humans, a user may be unaware when such an acoustic pulse is being applied to remove liquid from the acoustic cavity 28.

As shown in FIG. 3, acoustic module 12 may also include one or more sensors 33. In some cases, sensor 33 may include a pressure sensor, an optical sensor, a moisture sensor, a conductive sensor, or the like. Sensor 33 may either directly or indirectly detect the presence of liquid in acoustic cavity 28. For example, the sensor 33 may directly sense the presence of liquid in acoustic cavity 28 by detecting a change in optical, electrical, or moisture conditions as compared to reference condition when acoustic cavity 28 is evacuated or empty. In another example, sensor 33 may be an acoustic sensor and may indirectly detect the presence of liquid in acoustic cavity 28 by detecting a tone or acoustic pulse produced by the speaker or other acoustic element. In general, the presence of a liquid may dampen or alter the acoustic response of acoustic module 12. The acoustic response may be measured using sensor 33 and compared to a reference response to detect the presence of liquid in acoustic cavity 28 or other portions of acoustic module 12. In the example depicted in FIG. 3, sensor 33 is located proximate to acoustic cavity 28. However, another type of sensor may be used that is not proximate to acoustic cavity 28 or not located within acoustic module 12. For example, a microphone element of a microphone module may be used as a sensor, in some implementations.

Although portable electronic device 11 is illustrated and discussed as including controller unit 19 belonging to portable electronic device 11, in some cases controller 19 may be integrated into acoustic module 12. For example, in various implementations, acoustic module 12 may include a variety of additional components such as a controller that controls the speaker and other components to facilitate expulsion of liquid from the acoustic cavity. Additionally, although the examples provided above relate to an acoustic module having a speaker, similar elements and techniques could also be applied to an acoustic module having a microphone.

As described above, the use of hydrophobic mesh 24 may inhibit the entry of liquid into acoustic chamber 28. However, this same hydrophobic mesh may also inhibit the removal of liquid from acoustic chamber 28. As described above, the generation of acoustic energy pulses within acoustic module 12 may aid in moving liquid toward hydrophobic mesh portion 24 and opening 22. However, the liquid resistance provided by hydrophobic mesh 24 in FIG. 3 may make the removal process more difficult, insofar as the hydrophobic mesh may resist the expulsion of water therethrough. Accordingly and in some embodiments, an external surface of the screen element 24 may be configured to be hydrophobic and an internal surface of the screen element may be configured to be hydrophilic, such as utilizing one or more hydrophobic and/or hydrophilic coatings (such as polyethylene glycol and so on). Such hydrophobic external surfaces may resist the passage of liquids through the screen element from the external environment into the acoustic cavity 28 whereas the hydrophilic internal surfaces may aid the passage of liquids through the screen element from the acoustic cavity 28 toward the external environment. That is, the mesh may be manipulated such that the surface energy on one side of the mesh may be hydrophobic while the opposite side of the mesh may be more hydrophilic.

Figure 4:
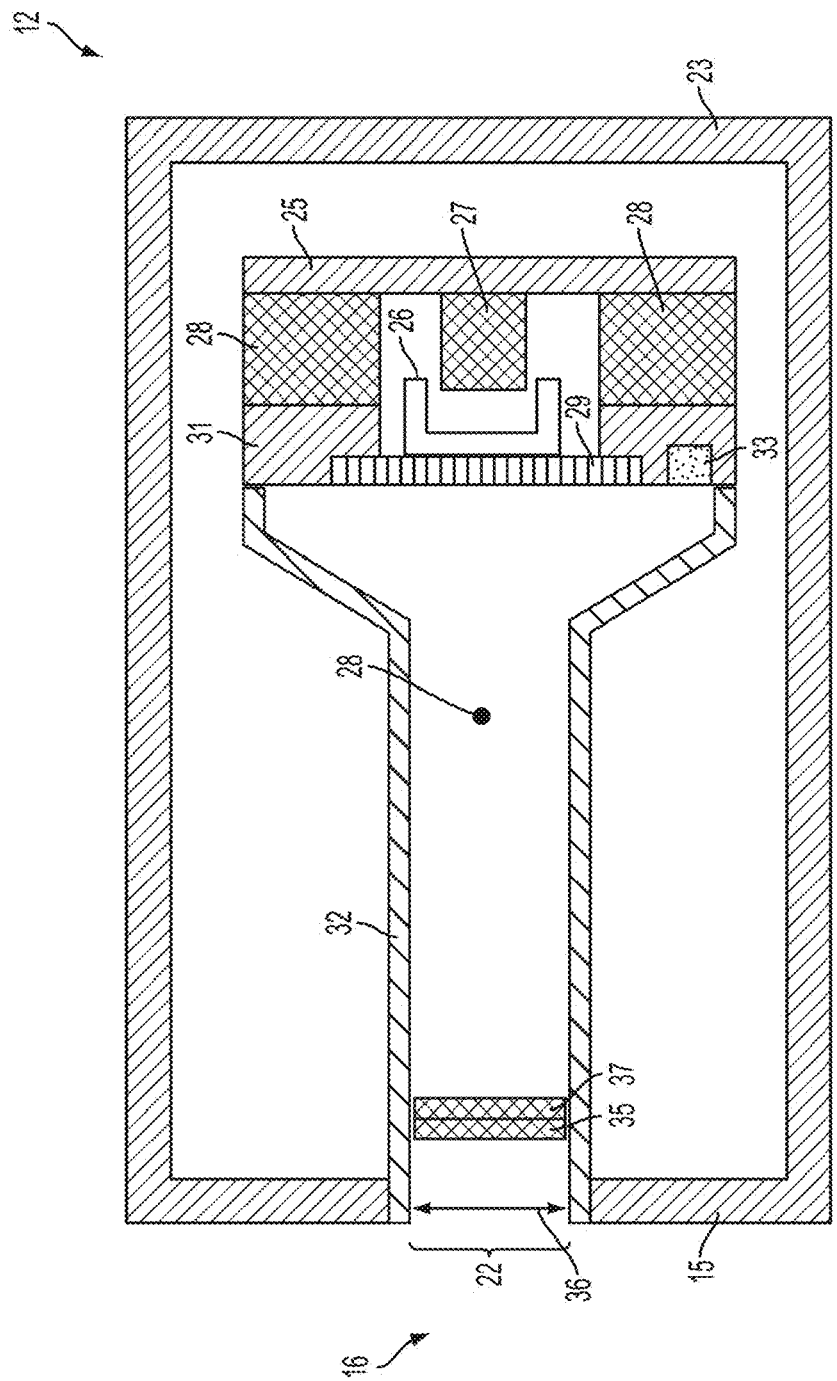
FIG. 4 depicts a cross-sectional view of one embodiment of an acoustic module taken along section A-A of FIG. 1.

Referring to FIG. 4, a cross-sectional view of acoustic module 12 as described in FIG. 3 depicting speaker acoustic module 12 and speaker acoustic port 16 taken along section A-A of FIG. 1. Speaker acoustic port 16 includes an opening 22 that facilitates the transmission of audible signals from acoustic module 12 to the user's ear. Orifice 22 through the housing 15 connects internal components of acoustic module 12 with the external environment. In this embodiment, screen 24 is replaced by a screen 34 having both hydrophobic and hydrophilic properties. That is, screen 34 includes a hydrophobic outer portion 35 adjacent to opening 36 and a hydrophilic inner portion 37 adjacent to the interior of acoustic cavity 28. The addition of hydrophilic inner portion 37 attracts liquid from the interior of acoustic cavity 28 and facilitates the removal of that liquid through opening 36 in acoustic port 16.

In some cases, additional optional operations may be performed to monitor the liquid removal process. For example, in some cases, a tone or acoustic signal may be generated by the speaker or other acoustic element of acoustic module 12. Because the presence of liquid may affect the acoustic response of acoustic module 12, the tone or acoustic signal may indicate the presence or quantity of liquid remaining in acoustic module 12. In one example, acoustic sensor 33 (e.g., a microphone) may be used to measure and quantify the tone or acoustic signal. The measurement of the tone or acoustic signal produced by acoustic module 12 may be compared to a known reference measurement that represents the acoustic response of acoustic module 12 when dry. Based on the comparison between the measured response and the reference measurement, the presence of liquid can be detected, and/or the quantity of any remaining liquid may be estimated.

Figure 5:
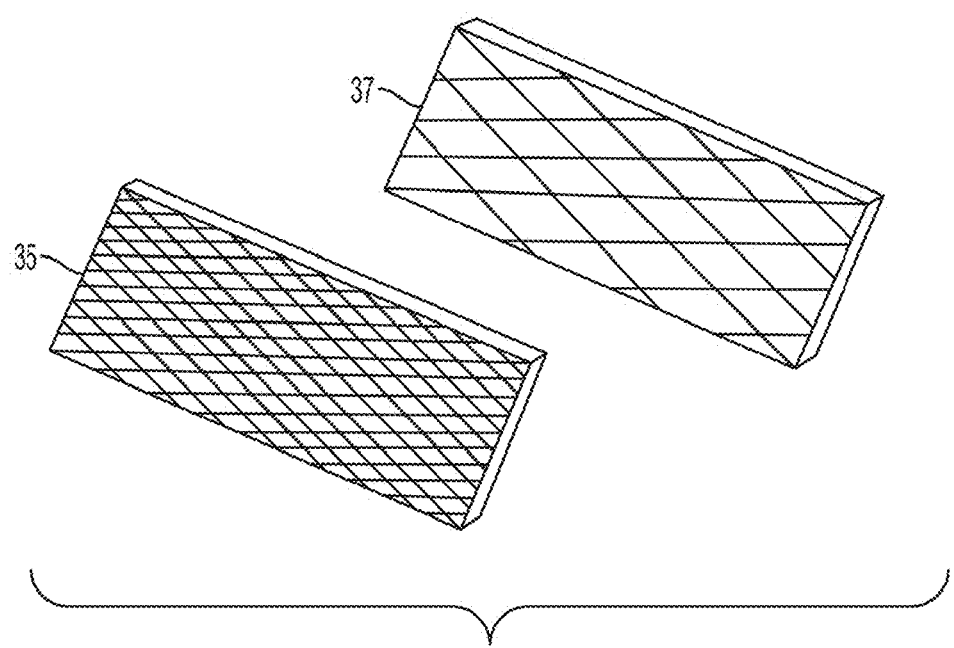
FIG. 5 depicts a perspective view of a two layer mesh screen.

Referring to FIG. 5, a perspective view of outer screen portion 35 and inner screen portion 37 made of liquid permeable material is shown. In one embodiment, outer screen portion 35 may be made of fine mesh and thus hydrophobic while inner screen portion 37 may be a coarse or rough mesh and thus hydrophilic. Screen portions 35 and 37 may be laminated together to form a single unit. Liquid may be moved by capillary action from the coarse inner screen portion 37 to the fine mesh outer screen portion 35 thus facilitating its removal from acoustic chamber 28. In general, in order to distinguish a fine mesh from a coarse mesh, the size of the openings between the mesh (which may be made of metal, nylon, or other synthetic materials) is used.

Various types of mesh sizing may be employed. For example, one example of mesh sizing is the US Standard sizing chart. Another is the so-called Tyler equivalent chart. For example, a #10 mesh Tyler Equivalent is identical to US Standard No. 12 mesh. This mesh equates to a wire width of approximately 0.8 mm and an opening size of approximately 1.7 mm. In general, the larger the mesh number, the smaller the opening size so a #20 Tyler Equivalent (US Standard No. 20) has an opening size of about 0.85 mm or half that of the #10 mesh (US Standard No. 12). In the present embodiment inner screen portion 37 may have a lower mesh number (larger sieve size) than outer screen portion 35 (smaller sieve size) such that inner screen portion 37 is more hydrophilic than outer screen portion 35 and conversely, outer screen portion 35 is more hydrophobic than inner screen portion 37.

Figure 6:
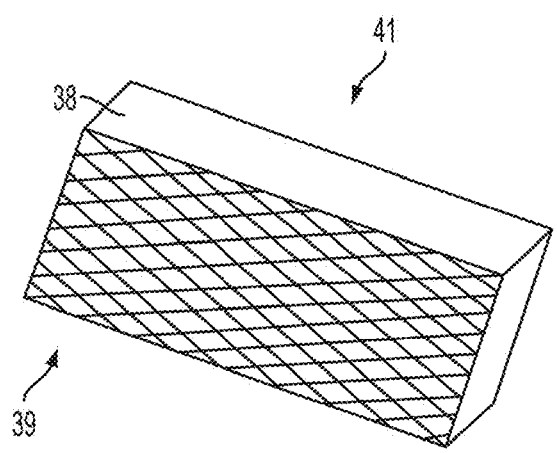
FIG. 6 depicts a mesh screen coated in accordance with one embodiment.

In another embodiment, as shown in FIG. 6, a single mesh portion 38 made of a liquid permeable material is shown with a hydrophobic outer side 39 and a hydrophilic inner side 41. In this embodiment and as one example, mesh portion 38 may be a nylon base material dipped in a flouropolymer to increase its hydrophobicity. A plasma etching process, such as an oxygen ($O^2$) or argon (Ar) based plasma etching, may be used to etch inner side 41 of mesh portion 38 to make it more hydrophilic.

In certain embodiments, a hydrophilic layer such as silicon dioxide ($SiO^2$) or silicon nitride (SiN) may coat the inner surface to further increase the hydrophilicity of inner side 41. The increase in the relative hydrophilicity may increase wetting of inner side 41 and facilitate movement of the liquid away from acoustic cavity 28 as described above. The hydrophilic layer may be deposited by physical vapor deposition, as one example.

Additional techniques may be applied to assist with the movement of the liquid. For example, if acoustic module 12 includes a speaker element, one or more acoustic energy pulses may be generated to help to drive a portion of the liquid toward one end of acoustic cavity 28 adjacent hydrophilic inner side 41. The exact tone and/or energy of the acoustic pulse may vary with the amount of liquid in the cavity 28, which may be determined through operation of the aforementioned sensor.

Figure 7:
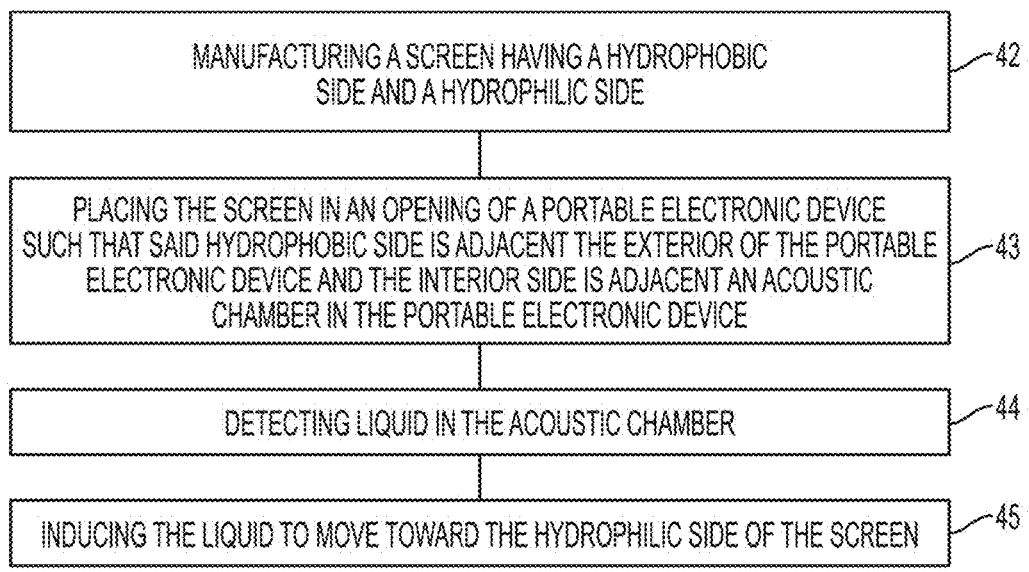
FIG. 7 is a flow chart depicting a process for removing liquid from an acoustic chamber.

Referring to FIG. 7, a flow chart of a method for removing liquid from acoustic chamber 28 in portable electronic device 11 is illustrated. In operation 42 a screen having a hydrophobic side and a hydrophilic side is manufactured. In operation 43, the screen is placed in an opening of a portable electronic device such that said hydrophobic side is adjacent the exterior of the portable electronic device and the interior side is adjacent the acoustic chamber in the portable electronic device. In operation 44, the portable electronic device detects that liquid is present in the acoustic chamber and in operation 45, the liquid is induced to move toward the hydrophilic side of the screen so as to be conducted to and through the hydrophilic side of the screen and the hydrophobic side of the screen and into the opening of the portable electronic device by wicking or capillary action through the screen.

Figure 8:
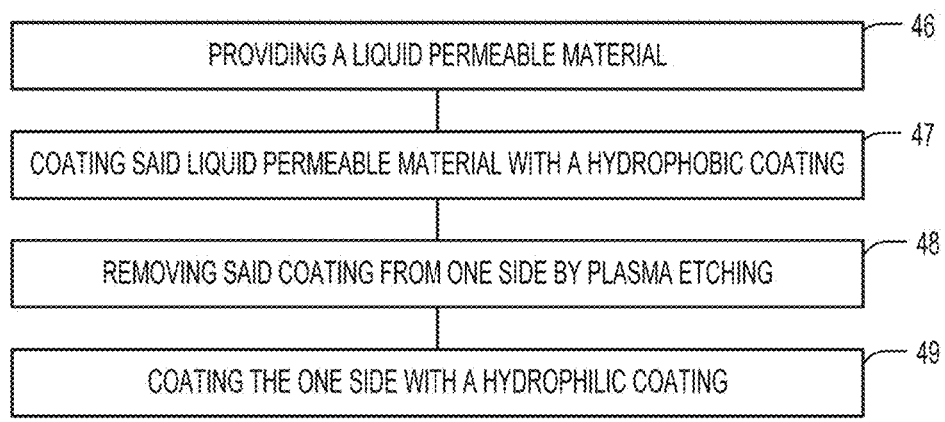
FIG. 8 is a flow chart of one method for manufacturing a cover for an acoustic chamber.

Referring to FIG. 8, a method for manufacturing a cover for an acoustic module is shown. In operation 46 a liquid permeable synthetic material, such as nylon, having a first side and a second side is provided. In operation 47, the liquid permeable material is coated with a hydrophobic coating, examples of which include manganese oxide polystyrene, zinc oxide polystyrene, precipitated calcium carbonate, carbon-nanotubes, silica nano-coating, polytetrafluoroethylene, silicon, or various flouropolymers. In operation 48, in one embodiment, the hydrophobic coating may be removed from one side by plasma etching such as an oxygen or argon plasma process. In operation 49, the side with the removed coating may be coated using physical vapor deposition with a hydrophilic coating such as silicon dioxide ($SiO^2$), polyethylene glycol or silicon nitride ($SiN^1$).

Figure 9:
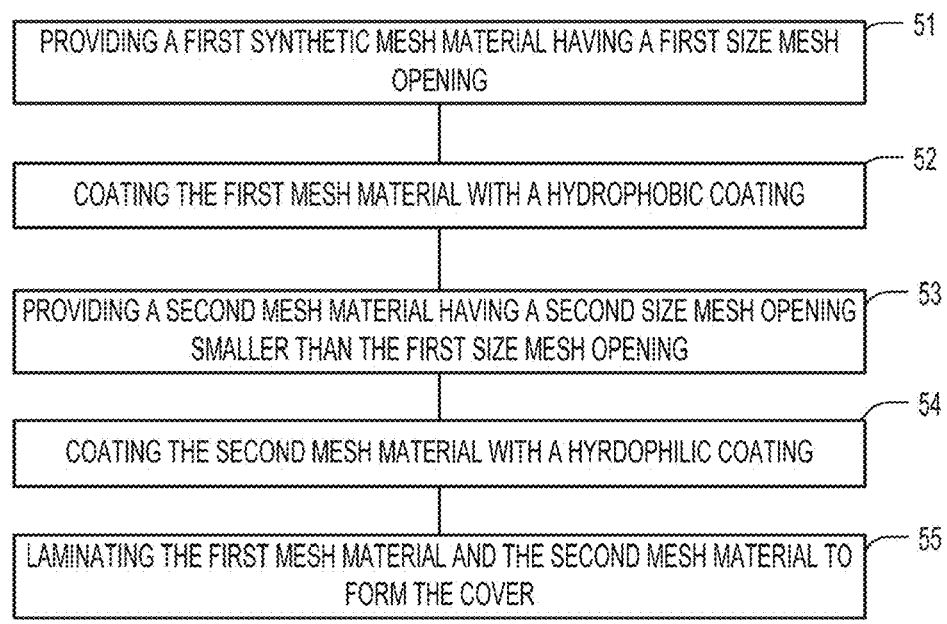
FIG. 9 is a flow chart of an alternate method for manufacturing a cover for an acoustic chamber.

Referring to FIG. 9, an alternate embodiment of a method for manufacturing a cover for an acoustic module is illustrated. In operation 51, a first synthetic mesh material such as nylon with a small mesh opening is provided. In operation 52, in one embodiment, the first mesh material may be coated by physical vapor deposition or other techniques with a hydrophobic coating such as manganese oxide polystyrene, zinc oxide polystyrene, precipitated calcium carbonate, carbon-nanotubes, silica nano-coating, polytetrafluoroethylene, silicon, or various flouropolymers. In operation 53, a second synthetic mesh material having a second size mesh opening smaller than the first size mesh opening is provided. In operation 54, in one embodiment, the second mesh material may be coated by physical vapor deposition or other techniques with a hydrophilic coating such as silicon dioxide ($SiO^2$); polyethylene glycol; and silicon nitride ($SiN^1$). In operation 55, the first mesh material and said second mesh material are laminated together to form the cover.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An acoustic module, comprising:
   an acoustic chamber having a tapered geometry such that a first end of the acoustic chamber is larger than a second end of the acoustic chamber;
   a port comprising a plurality of openings, the port being adjacent an external environment and the first end of the acoustic chamber;
   a semi-permeable barrier material disposed within the acoustic chamber; and
   an audio component at the second end of the acoustic chamber, the audio component being configured to emit acoustic waves that move moisture within the acoustic chamber toward and through the semi-permeable barrier material and the port.

2. The acoustic module of claim 1, wherein the semi-permeable barrier material is a synthetic mesh.

3. The acoustic module of claim 1, wherein the acoustic waves comprise acoustic energy pulses.

4. The acoustic module of claim 1, further comprising:
   a sensor configured to identify moisture within the acoustic chamber,
   wherein the audio component is configured to emit acoustic waves in response to the sensor identifying moisture within the acoustic chamber.

5. The acoustic module of claim 1, wherein the audio component is a speaker.

6. The acoustic module of claim 5, wherein the speaker comprises a diaphragm that is wider than the port.

7. The acoustic module of claim 1, wherein a first side of the semi-permeable barrier material has a smaller opening size than a second side of the semi-permeable barrier material.

8. An electronic device, comprising:
   a device housing comprising a wall
   an acoustic port comprising one or more openings extending through the wall of the device housing;
   a protective screen aligned with the acoustic port; and
   an audio component disposed within the device housing and secured to the wall, the audio component cooperating with the device housing to enclose an acoustic chamber between the acoustic port and a diaphragm of the audio component, the acoustic chamber having a tapered geometry such that a first portion of the acoustic chamber adjacent to the audio component is larger than a second portion of the acoustic chamber adjacent to the acoustic port the diaphragm being configured to generate acoustic waves that move moisture towards and through the protective screen.

9. The electronic device of claim 8, wherein the diaphragm is wider than the acoustic port oriented towards the acoustic port.

10. The electronic device of claim 8, wherein a portion of the audio component is sealed to a surface of the device housing.

11. The electronic device of claim 8, wherein the protective screen comprises a synthetic mesh.

12. The electronic device of claim 8, wherein the protective screen comprises a layer of fine mesh and a layer of coarse mesh.

13. The electronic device of claim 8, wherein the audio component is configured to adjust a tone or energy of the acoustic waves generated by the diaphragm in accordance with an amount of liquid within the acoustic chamber.

14. The electronic device of claim 8, wherein the acoustic chamber is isolated from the interior volume defined by the device housing.

15. An electronic device, comprising:
   a housing comprising: a wall having an interior-facing surface, and an acoustic port comprising one or more openings extending through the wall;
   a speaker assembly disposed within the interior volume and sealed to a portion of the interior-facing surface that includes the acoustic port, the speaker assembly comprising a diaphragm; and
   an acoustic chamber positioned between the acoustic port and the speaker assembly, the acoustic chamber having a tapered geometry such that a first portion of the acoustic chamber adjacent to the speaker assembly is larger than a second portion of the acoustic chamber adjacent to the acoustic port, wherein the diaphragm is configured to generate acoustic waves that bias liquid within the acoustic chamber out of the housing through the acoustic port.

16. The electronic device of claim 15, further comprising a screen positioned within the acoustic chamber and between the acoustic port and the speaker assembly.

17. The electronic device of claim 16, wherein the screen comprises a plurality of layers of mesh laminated together.

18. The electronic device of claim 15, wherein the diaphragm has a larger area than an area across which the acoustic port extends.

19. The electronic device of claim 15, wherein the diaphragm is configured to play a tone that biases the liquid out of the housing.

20. The electronic device of claim 15, further comprising a sensor configured to detect liquid disposed within the speaker assembly.

* * * * *